(12) United States Patent
Nashiki et al.

(10) Patent No.: US 9,142,332 B2
(45) Date of Patent: Sep. 22, 2015

(54) TRANSPARENT CONDUCTIVE FILM

(71) Applicant: NITTO DENKO CORPORATION, Ibaraki-shi, Osaka (JP)

(72) Inventors: Tomotake Nashiki, Osaka (JP); Tomonori Noguchi, Osaka (JP); Motoki Haishi, Osaka (JP); Kuniaki Ishibashi, Osaka (JP)

(73) Assignee: NITTO DENKO CORPORATION, Ibaraki-shi (JP)

( * ) Notice: Subject to any disclaimer, the term of this patent is extended or adjusted under 35 U.S.C. 154(b) by 0 days.

(21) Appl. No.: 14/110,196

(22) PCT Filed: Oct. 1, 2012

(86) PCT No.: PCT/JP2012/075360
§ 371 (c)(1),
(2) Date: Oct. 7, 2013

(87) PCT Pub. No.: WO2013/051500
PCT Pub. Date: Apr. 11, 2013

(65) Prior Publication Data
US 2014/0050908 A1 Feb. 20, 2014

(30) Foreign Application Priority Data

Oct. 5, 2011 (JP) .................................. 2011-221073
Aug. 30, 2012 (JP) .................................. 2012-189458

(51) Int. Cl.
*H01B 5/14* (2006.01)
*B32B 7/02* (2006.01)
(Continued)

(52) U.S. Cl.
CPC .. *H01B 5/14* (2013.01); *B32B 7/02* (2013.01); *C23C 14/086* (2013.01);
(Continued)

(58) Field of Classification Search
CPC ............ B32B 7/02; B32B 9/00; C23C 14/06; C23C 14/08; C23C 14/58; C23C 14/3492; C23C 14/5806; C23C 14/086; H01B 5/14; H01L 31/022466; G06F 3/044
USPC ................. 428/688–689, 697, 699, 701–702, 428/212–220, 480, 500, 412, 332–337; 345/173–178
See application file for complete search history.

(56) References Cited

U.S. PATENT DOCUMENTS 5,225,273 A * 7/1993 Mikoshiba et al. ........... 428/323
6,743,488 B2 * 6/2004 Memarian et al. ............. 428/1.4
(Continued)

FOREIGN PATENT DOCUMENTS

CN 1525912 A 9/2004
CN 102102187 A 6/2011
(Continued)

OTHER PUBLICATIONS

Dobrowolski, J.A. (eds. Bass et al.). "Chapter 42: Optical Properties of Films and Coatings". Handbook of Optics: vol. I, Fundamentals, Techniques, and Design, McGraw-Hill, Inc., (1995); pp. 42.3-42.130.*

(Continued)

*Primary Examiner* — Prashant J Khatri
(74) *Attorney, Agent, or Firm* — Westerman, Hattori, Daniels & Adrian, LLP

(57) ABSTRACT

A transparent conductive film comprises: a film substrate having two main surfaces; and a transparent conductor layer formed on one main surface of the film substrate. The transparent conductor layer is composed of three layers in which a first indium tin oxide layer, a second indium tin oxide layer, and a third indium tin oxide layer are laminated in this order from the film substrate side. The first indium tin oxide layer has a smaller tin oxide content than the second indium tin oxide layer has. The third indium tin oxide layer has a smaller tin oxide content than the second indium tin oxide layer has.

14 Claims, 1 Drawing Sheet

(51) Int. Cl.
*C23C 14/08* (2006.01)
*C23C 14/34* (2006.01)
*C23C 14/58* (2006.01)
*G06F 3/044* (2006.01)
*H01L 31/0224* (2006.01)
*H01L 31/18* (2006.01)

(52) U.S. Cl.
CPC ........ *C23C 14/3492* (2013.01); *C23C 14/5806* (2013.01); *G06F 3/044* (2013.01); *H01L 31/022475* (2013.01); *H01L 31/1884* (2013.01); *Y02E 10/50* (2013.01); *Y10T 428/2495* (2015.01); *Y10T 428/24975* (2015.01); *Y10T 428/266* (2015.01); *Y10T 428/31507* (2015.04); *Y10T 428/31786* (2015.04); *Y10T 428/31855* (2015.04)

(56) References Cited

U.S. PATENT DOCUMENTS

| 7,348,966 | B2* | 3/2008 | Hong et al. ................... 345/173 |
| 2003/0035906 | A1 | 2/2003 | Memarian et al. |
| 2008/0261030 | A1 | 10/2008 | Nashiki et al. |
| 2012/0111718 | A1 | 5/2012 | Haishi et al. |

FOREIGN PATENT DOCUMENTS

| JP | 08-043840 A | 2/1996 |
| JP | 2000-045063 A | 2/2000 |
| JP | 2008-071531 A | 3/2008 |
| JP | 2010-061837 A | 3/2010 |
| JP | 2012-112031 A | 6/2012 |
| WO | 2011/093274 A1 | 8/2011 |

OTHER PUBLICATIONS

Paine et al. "A study of low temperature crystallization of amorphous thin film indium-tin-oxide". Journal of Applied Physics, vol. 85, (1999); pp. 8445-8450.*

Internation Search Report for PCT/JP2012/075360, Mailing Date of Dec. 11, 2012.

Chinese Office Action dated Dec. 9, 2013, in corresponding Chinese Application No. 201280006323.0.

* cited by examiner

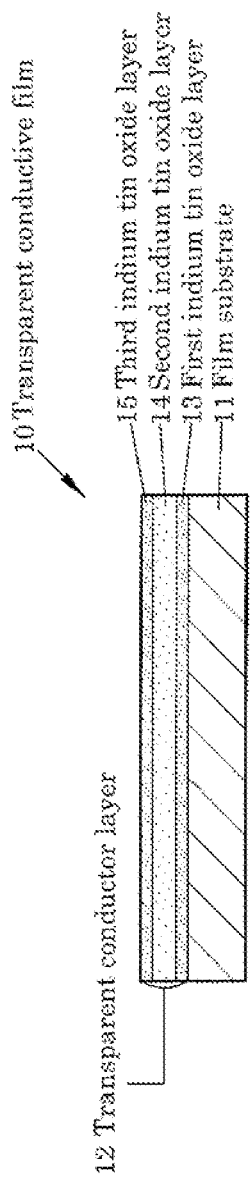

TRANSPARENT CONDUCTIVE FILM

BACKGROUND OF THE INVENTION

1. Field of the Invention

The present invention relates to a transparent conductive film using an indium tin oxide (ITO) layer.

2. Description of the Related Art

A transparent electrode plate, in which three layers of indium tin oxide are laminated on a glass substrate, is well-known (For instance, Japanese Unexamined Patent Application Publication No. JP 08-43840 A). In a transparent electrode plate in JP 08-43840 A, the content of tin oxide ($SnO_2$) contained in a first layer and a third layer of indium tin oxide is greater than the content of tin oxide contained in a second layer of indium tin oxide. This makes it possible to minimize a surface resistance value of the transparent electrode plate.

Since a sputtering layer of indium tin oxide is amorphous, the sputtering layer has a high surface resistance value as deposition. To minimize the surface resistance value of the sputtering layer, it is necessary to crystallize, the indium tin oxide by heat treatment (crystallization treatment). In JP 08-43840 A, the temperature and time of crystallization treatment are typically 200° C., 60 minutes.

However, when a film substrate is used instead of a glass substrate, it is impossible to perform a crystallization treatment at a high temperature (about 200° C.) like the case of a glass plate due to low heat resistance of the film substrate. Accordingly, when a film substrate is used, there are problems that it is impossible to perform a crystallization treatment on the indium tin oxide or it takes too much time to perform a crystallization treatment in the conventional constitution of three layer-indium tin oxide.

SUMMARY OF THE INVENTION

It is an object of the present invention to perform crystallization treatment of indium tin oxide at a low temperature that is lower than the heatproof temperature (for instance, 140° C.) of the film substrate in a short time (for instance, 60 minutes) in a transparent conductive film in which a plurality of indium tin oxide layers are formed on the film substrate so as to minimize a surface resistance value (for instance, 200 ohms per square or less).

The summary of the present invention is described as below.

In a first preferred aspect, there is provided a transparent conductive film according to the present invention which comprises a film substrate having two main surfaces; and a transparent conductor layer formed on one main surface of the film substrate. The transparent conductor layer is composed of three layers in which a first indium to oxide layer, a second indium tin oxide layer, and a third indium tin oxide layer are laminated in this order from the film substrate side. The first indium tin oxide layer has a smaller tin oxide content than the second indium tin oxide layer has. The third indium tin oxide layer has a smaller tin oxide content than the second indium tin oxide layer has.

In a second preferred aspect of the transparent conductive film according to the present invention, the first indium tin oxide layer has a thickness smaller than the second indium tin oxide layer has. The third indium tin oxide layer has a thickness smaller than the second indium tin oxide layer has.

In a third preferred aspect of the transparent conductive film according to the present invention, the first indium tin oxide layer has a tin oxide content of 1% by weight to 5% by weight. The second indium tin oxide layer has a tin oxide content of 6% by weight to 15% by weight. The third indium tin oxide layer has a tin oxide content of 1% by weight to 5% by weight.

In a fourth preferred aspect of the transparent conductive film according to the present invention, the difference between the tin oxide content of the second indium tin oxide layer and the tin oxide content of the first indium tin oxide layer is 3% by weight to 10% by weight. The difference between the tin oxide content of the second indium tin oxide layer and the tin oxide content of the third indium tin oxide layer is 3% by weight to 10% by weight.

In a fifth preferred aspect of the transparent conductive film according to the present invention, the first indium tin oxide layer has a thickness of 1 nm to 10 nm. The second indium tin oxide layer has a thickness of over 10 nm to 30 nm or smaller. The third indium tin oxide layer has a thickness of 1 nm to 10 nm.

In a sixth preferred aspect of the transparent conductive film according to the present invention, the difference between the thickness of the second indium tin oxide layer and the thickness of the first indium tin oxide layer is 2 nm to 20 nm. The difference between the thickness of the second indium tin oxide layer and the thickness of the third indium tin oxide layer is 2 nm to 20 nm.

In a seventh preferred aspect of the transparent conductive film according to the present invention, the first indium tin oxide layer, the second indium tin oxide layer, and the third indium tin oxide layer in the transparent conductor layer are respectively a crystalline layer obtained by respectively crystallizing an amorphous layer of indium tin oxide by heat treatment.

In an eighth preferred aspect of the transparent conductive film according to the present invention, the transparent conductor layer has a thickness (thickness of the first indium tin oxide layer thickness of the second indium tin oxide layer+ thickness of the third indium tin oxide layer) of 14 nm to 50 nm.

In a ninth preferred aspect of the transparent conductive film according to the present invention, a material for the film substrate includes polyethylene terephthalate, polycycloolefin or polycarbonate.

In a tenth preferred aspect of the transparent conductive film according to the present invention, the film substrate has a thickness of 10 µm to 200 µm.

ADVANTAGES OF THE INVENTION

According to the present invention, in the transparent conductive film in which an indium tin oxide layer is formed on the film substrate, it is possible to perform a crystallization treatment of indium tin oxide at a low temperature (for instance, crystallization temperature: 140° C.), and in a short time (for instance, crystallization time: 60 minutes) and minimize a surface resistance value (for instance, 200 ohms per square or lower).

BRIEF DESCRIPTION OF THE DRAWING

FIG. 1 is a cross-sectional schematic view of a transparent conductive, film of the present invention.

DESCRIPTION OF THE PREFERRED EMBODIMENTS

[Transparent Conductive Film of the Present Invention]

As shown in FIG. 1, a transparent conductive film 10 of the present invention comprises: a film substrate 11 having two main surfaces; and a transparent conductor layer 12 formed on one main surface of the film substrate 11. The transparent conductor layer 12 is composed of three layers in which a first indium tin oxide layer 13, a second indium tin oxide layer 14, and a third indium tin oxide layer 15 are laminated in this order from the film substrate 11 side.

The first indium tin oxide layer 13, the second indium tin oxide layer 14, and the third indium tin oxide layer 15 to be used in the present invention are respectively a compound layer in which tin oxide ($SnO_2$) has been doped with indium oxide ($In_2O_3$). In the transparent conductor layer 12 to be used in the present invention, the first indium tin oxide layer 13 has a smaller tin oxide content than the second indium tin oxide layer 14 has. Further, the third indium tin oxide layer 15 has a smaller tin oxide content than the second indium tin oxide layer 14 has.

In the transparent conductive film 10 of the present invention, it is possible to minimize a surface resistance value down to 200 ohms per square or lower by heat treatment (crystallization treatment) at a low temperature and in a short time; for instance, 140° C., for 60 minutes. Furthermore, it is also possible to minimize the surface resistance value down to 100 ohms per square to 150 ohms per square.

When the transparent conductive film 10 of the present invention is used for a projection capacitance-type touch panel, the transparent conductor layer 12 of the transparent conductive film 10 is preferably patterned. A pressure-sensitive adhesive layer is formed on the film substrate 11 so that patterns of the transparent conductor layer 12 may be embedded. According to such a configuration, it is possible to detect multi-point-touch input and upgrade detection performance by adjusting permittivity.

[Film Substrate]

The film substrate 11 to be used in the present invention is preferably superior in transparency and heat resistance. A material for the film substrate 11 is not limited as long as having such functions. The film substrate 11 preferably has a thickness of 10 μm to 200 μm, more preferably 20 μm to 50 μm from the point of view of production of the high-quality transparent conductor layer 12. Examples of the material for the film substrate 11 preferably include polyethylene terephthalate, polycycloolefin or polycarbonate. The film substrate 11 may include an easily adhering layer or a hard coating layer formed on a surface thereof.

[Transparent Conductor Layer]

The transparent conductor layer 12 to be used in the present invention is composed of three layers in which the first indium tin oxide layer 13, the second indium tin oxide layer 14, and the third indium tin oxide layer 15 are laminated in this order from the film substrate 11 side. The first indium tin oxide layer 13, the second indium tin oxide layer 14, and the third indium tin oxide layer 15 to be used in the present invention are respectively a compound layer in which tin oxide ($SnO_2$) has been doped with indium oxide ($In_2O_3$).

The tin oxide content of the first indium tin oxide layer 13 is smaller than that of the second indium tin oxide layer 14. Further, the tin oxide content of the third indium tin oxide layer 15 is smaller than that of the second indium tin oxide layer 14.

The first indium tin oxide layer 13, the second indium tin oxide layer 14, and the third indium tin oxide layer 15 in the transparent conductor layer 12 to be used in the present invention are respectively a crystalline layer typically obtained by crystallizing (poly-crystallizing) an amorphous layer of indium tin oxide by heat treatment (crystallization treatment).

The transparent conductor layer 12 to be used in the present invention preferably has a thickness (thickness of the first indium tin oxide layer 13 thickness of the second indium tin oxide layer 14+thickness of the third indium tin oxide layer 15) of 14 nm to 50 nm and more preferably 18 nm to 41 nm.

In general, the greater the content of tin oxide in the indium tin oxide layer becomes, the lower a surface resistance value of the indium tin oxide layer becomes. On the contrary, the indium tin oxide layer tends to have a higher crystallization temperature and longer crystallization time. The transparent conductive film 10 of the present invention is, however, configured to interpose the second indium tin oxide layer 14 with a great tin oxide content between the first indium tin oxide layer 13 with a small tin oxide content and the third indium tin oxide layer 15 with a small tin oxide content. The first indium tin oxide layer 13 and the third indium tin oxide layer 15 respectively have a low crystallization temperature and short crystallization time because of respectively having a small tin oxide content. The second indium tin oxide layer 14 alone has a high crystallization temperature and long crystallization time because of having a great tin oxide content. However, the second indium tin oxide layer 14 is laminated between the first indium tin oxide layer 13 and the third indium tin oxide layer 15 respectively having a low crystallization temperature and short crystallization time. Accordingly, the second indium tin oxide layer 14 is subject to effects of the first indium tin oxide layer 13 and the third indium tin oxide layer 15, so that the crystallization temperature thereof becomes lower and the crystallization time thereof becomes shorter than a single layer. This makes it possible for the transparent conductive layer 10 of the present invention to lower the crystallization temperature of the second indium tin oxide layer 14 and reduce the crystallization time.

Specifically, it is possible to prevent a volatile component generated from the film substrate 11 from blocking crystallization of the transparent conductor layer in a film forming process (in sputtering) by forming the first indium tin oxide layer 13 with a small tin oxide content on the film substrate 11 side (when the tin oxide content is small, it is insusceptible to the blocking of crystallization by the volatile component). In addition, it is possible to reduce time until crystallization of the transparent conductor layer 12 is initiated by forming the third indium tin oxide layer 15 with a small tin oxide content on a side that is in contact with air (when the tin oxide content is small, crystallization is easy). As a result, crystallization of the entire transparent conductor layer 12 including the second indium tin oxide layer 14 is promoted, resulting in minimization of the surface resistance value by crystallization at a to temperature and in a short time.

The tin oxide content (% by weight) herein represents {weight of tin oxide/(weight of indium oxide+weight of tin oxide)}×100(%). The tin oxide content of the first indium tin oxide layer 13 is preferably 1% by weight to 5% by weight, more preferably 2% by weight to 4% by weight to 5% The tin oxide content of the second indium tin oxide layer 14 is preferably 6% by weight to 15% by weight, more preferably by weight to 12% by weight. The tin oxide content of the third indium tin oxide layer 15 is preferably 1% by weight to 5% by weight, more preferably 2% by weight to 4% by weight.

The tin oxide content of the first indium tin oxide layer 13 may be identical to or different from the tin oxide content of the third indium tin oxide layer 15. The difference between the tin oxide content of the second indium tin oxide layer 14 and the tin oxide content of the first indium tin oxide layer 13 is preferably 3% by weight to 10% by weight, more preferably 5% by weight to 8% by weight. The difference between the tin oxide content of the second indium tin oxide layer 14 and the tin oxide content of the third indium tin oxide layer 15 is preferably 3% by weight to 10% by weight, more preferably 5% by weight to 8% by weight.

The first indium tin oxide layer 13 preferably has a thickness of 1 nm to 10 nm, more preferably 1.5 nm to 8 nm. The thickness of the first indium tin oxide layer 13 is preferably smaller than the thickness of the second indium tin oxide layer 14. The second indium tin oxide layer 14 preferably has a thickness of over 10 nm to 30 nm or less, more preferably 12 nm to 30 nm, further preferably 15 nm to 25 nm. The thickness of the second indium tin oxide layer 14 is preferably greater than the thickness of the first indium tin oxide layer 13 and the thickness of the third indium tin oxide layer 15. The third indium tin oxide layer 15 preferably has a thickness of 1 nm to 10 nm, more preferably 1.5 nm to 8 nm. The thickness of the third indium tin oxide layer 15 is smaller than the thickness of the second indium tin oxide layer 14.

The thickness of the first indium tin oxide layer 13 may be identical to or different from the thickness of the third indium tin oxide layer 15. The difference between the thickness of the second indium tin oxide layer 14 and the thickness of the first indium tin oxide layer 13 is preferably 2 nm to 20 nm, more preferably 5 nm to 20 nm, further preferably 10 nm to 17 nm. The difference between the thickness of the second indium tin oxide layer 14 and the thickness of the third indium tin oxide layer 15 is preferably 2 nm to 20 nm, more preferably 5 nm to 20 nm, further preferably 10 nm to 17 nm.

It is possible to further promote crystallization of the transparent conductor layer 12 by limiting the tin oxide content and the thickness of the first indium tin oxide layer 13, the tin oxide content and the thickness of the second indium tin oxide layer 14, and the tin oxide content and the thickness of the third indium tin oxide layer 15 to be within the aforementioned range and the aforementioned difference and to reduce the surface resistance value by heat treatment at a lower temperature and in a shorter time.

[Production Method]

One example of a method for producing the transparent conductive film 10 of the present invention will now be described in detail. First, the long film substrate 11 made of a roll of 500 m to 5,000 m is located in a sputtering device. The first indium tin oxide layer 13, the second indium tin oxide layer 14, and the third indium tin oxide layer 15 are continuously formed on one side of the film substrate 11 by sputtering while reminding the film substrate 11 at a predetermined speed.

In the sputtering method, cation in plasma generated in a low-pressure gas (for instance, a low-pressure argon gas) is caused to collide with a sintering body target (negative electrode) of indium tin oxide. Indium tin oxide scattered from a surface of the sintering body target is caused to attach on the film substrate 11. At this time, at least three sintering body targets of indium tin oxide each having a different tin oxide content are provided in the sputtering device. This makes it possible to continuously form three indium tin oxide layers (the first indium tin oxide layer 13, the second indium tin oxide layer 14, and the third indium tin oxide layer 15). After sputtering, the first indium tin oxide layer 13, the second indium tin oxide layer 14, and the third indium tin oxide layer 15 (before being heat-treated) are all amorphous layers.

The long film substrate 11, on which three indium tin oxide layers (the first indium tin oxide layer 13, the second indium tin oxide layer 14, and the third indium tin oxide layer 15) are formed, is wound up to be rolled.

The long film substrate 11 in a roll shape is continuously carried in a heating oven while being rewound to cause the three indium tin oxide layers (the first indium tin oxide layer 13, the second indium tin oxide layer 14, and the third indium tin oxide layer 15) to be heat-treated. The heating temperature (crystallization temperature) is preferably 140° C. to 170° C. and the heating time (crystallization time) is preferably 30 minutes to 60 minutes. The first indium tin oxide layer 13, the second indium tin oxide layer 14, and the third indium tin oxide layer 15 are converted from being amorphous to being crystalline.

In this way, a long transparent conductive film 10 having the transparent conductor layer 12, on which the first indium tin oxide layer 13, the second indium tin oxide layer 14, and the third indium tin oxide layer 15 are laminated in this order from the film substrate 11 side, is obtained.

EXAMPLES

Example 1

An undercoat layer (thickness: 30 nm) made of a thermosetting resin including a melamine resin was formed on a polyethylene terephthalate film with a thickness of 23 μm to prepare a roll-shaped long film substrate. The roll-shaped long film substrate was arranged in a sputtering device with gas pressure in a 0.4 Pa atmosphere composed of 80% by volume of argon gas and 20% by volume of oxygen gas.

An amorphous layer of first indium tin oxide (tin oxide content: 3.3% by weight; thickness: 5.2 nm), an amorphous layer of second indium tin oxide (tin oxide content: 10% by weight; thickness: 15.6 nm), and an amorphous layer of third indium tin oxide (tin oxide content: 3.3% by weight; thickness: 5.2 nm) were sequentially formed on one side-surface of the film substrate while rewinding the roll-shaped long film substrate at a fixed rate to form a transparent conductor layer with a total thickness of 26 nm.

The long film substrate, on which a transparent conductor layer composed of an amorphous layer which comprises three-layered indium tin oxide was formed, was once wound up in the shape of a roll. The roll was continuously carried in a heating oven at 140° C. while having been rewound to perform heat treatment (crystallization treatment).

As a result, a transparent conductive film with a transparent conductor layer formed on the long film substrate was obtained. The transparent conductor layer is composed of three layers in which the first indium tin oxide layer (crystalline layer), the second indium tin oxide layer (crystalline layer), and the third indium tin oxide layer (crystalline layer) were laminated in this order from the film substrate side. The tin oxide content and the thickness of the first indium tin oxide, layer were the same as before heat treatment. The tin oxide content and the thickness of the second indium tin oxide layer were the same as before heat treatment. The tin oxide content and the thickness of the third indium tin oxide layer were the same as before heat treatment. Table 1 shows surface resistance values and crystallization time of the thus obtained transparent conductive film.

Example 2

An amorphous layer of first indium tin oxide was set to have a thickness of 6.5 nm, an amorphous layer of second indium tin oxide was set to have a thickness of 13 nm, and an amorphous layer of third indium tin oxide was set to have a thickness of 6.5 nm. A transparent conductive film was produced in the same manner as in Example 1 except for the above. Table 1 shows surface resistance values and crystallization time of the thus obtained transparent conductive film.

Example 3

An amorphous layer of first indium tin oxide was set to have a thickness of 7.8 nm, an amorphous layer of second indium tin oxide was set to have a thickness of 10.4 nm, and an amorphous layer of third indium tin oxide was set to have a thickness of 7.8 nm. A transparent conductive film was produced in the same manner as in Example 1 except for the above. Table 1 shows surface resistance values and crystallization time of the thus obtained transparent conductive film.

Comparative Example 1

An amorphous layer of first indium tin oxide was set to have a tin oxide content of 10% by weight and a thickness of 5.2 nm. An amorphous layer of second indium tin oxide was set to have a tin oxide content of 3.3% by weight and a thickness of 15.6 nm. An amorphous layer of third indium tin oxide was set to have a tin oxide content of 10% by weight and a thickness of 5.2 nm. The total thickness of 26 nm of the transparent conductor layer is the same as in Example 1. A transparent conductive film was produced in the same manner as in Example 1 except for the above. Table 1 shows surface resistance values of the thus obtained transparent conductive film. The transparent conductor layer in Comparative Example 1 was not crystallized.

Comparative Example 2

The number of layers composed of the transparent conductor layer was changed from three to two. An amorphous layer of first indium tin oxide was set to have a tin oxide content of 3.3% by weight and a thickness of 15.6 nm. An amorphous layer (a layer which is in contact with air) of second indium tin oxide was set to have, a tin oxide content of 10% by weight and a thickness of 10.4 nm. The total thickness 26 nm of the transparent conductor layer is the same as in Example 1. A transparent conductive film was produced in the same manner as in Example 1 except for the above. Table 1 shows surface resistance values of the thus obtained transparent conductive film.

Comparative Example 3

The number of layers composed of the transparent conductor layer was changed from three to one. An amorphous layer of indium tin oxide was set to have a tin oxide content of 10% by weight and a thickness of 26 nm. The thickness of 26 nm of the transparent conductor layer was the same as in Example 1. A transparent conductive film was produced in the some manner as in Example 1 except for the above. Table 1 shows surface resistance values of the thus obtained transparent conductive film. The transparent conductor layer in Comparative Example 3 was not crystallized.

Comparative Example 4

The number of layers composed of the transparent conductor layer was changed from three to one. An amorphous layer of indium tin oxide was set to have a tin oxide content of 3.3% by weight and a thickness of 26 nm. The thickness of 26 nm of the transparent conductor layer was the same as in Example 1. A transparent conductive film was produced in the same manner as in Example 1 except for the above. Table 1 shows surface resistance values of the thus obtained transparent conductive film.

TABLE 1

| | Transparent conductor layer | Tin oxide content (% by weight) Layer thickness (nm) First layer/second layer/third layer | Surface resistance ($\Omega$/square) | Crystallization time (minutes) |
| --- | --- | --- | --- | --- |
| Example 1 | Three-layer | 3.3/10/3.3 5.2/15.6/5.2 | 128 | 60 |
| Example 2 | Three-layer | 3.3/10/3.3 6.5/13/6.5 | 138 | 60 |
| Example 3 | Three-layer | 3.3/10/3.3 7.8/10.4/7.8 | 150 | 60 |
| Comparative Example 1 | Three-layer | 10/3.3/10 5.2/15.6/5.2 | 380 | Not crystallized |
| Comparative Example 2 | Two-layer | 3.3/10 15.6/10.4 | 153 | 90 |
| Comparative Example 3 | One-layer | 10 26 | 410 | Not crystallized |
| Comparative Example 4 | One-layer | 3.3 26 | 265 | 60 |

In the case where a transparent conductor layer is composed of three layers, a tin oxide content and a thickness thereof indicate values of a first layer/a second layer/a third layer. In the case where the transparent conductor layer is composed of two layers, the tin oxide content and the thickness thereof indicate values of a first layer/a second layer.

When the transparent conductor layer is composed of three layers, the tin oxide content and the thickness thereof indicate numerical numbers of a first layer/a second layer/a third layer from the film substrate side. When the transparent conductor layer is composed of two layers, the tin oxide content and the thickness thereof indicate numerical numbers of a first layer/a second layer from the film substrate side.

[Evaluation]

As shown in Table 1, in the transparent conductive film of the present invention in Examples 1 to 3, the tin oxide content of the first indium tin oxide layer is smaller than that of the second indium tin oxide layer. Further, the tin oxide content of the third indium tin oxide layer is smaller than that of the second indium tin oxide layer. Furthermore, the thickness of the first indium tin oxide layer is smaller than the thickness of the second indium tin oxide layer. Moreover, the thickness of the third indium tin oxide layer is smaller than the thickness of the second indium tin oxide layer. Such overall effects made it possible to reduce surface resistance values as well as reducing crystallization time of the transparent conductive film of the present invention.

[Measuring Method]
[Surface Resistance Value]

A surface resistance value was measured using a general four-terminal method.

[Crystallization Time]

Crystallization time was determined at the time when the surface resistance value of the transparent conductive film became substantially constant.

[Tin Oxide Content]

The tin oxide content of a sintering body target of indium tin oxide arranged in a sputtering device was determined as a tin oxide content of an indium tin oxide layer.

[Layer Thickness]

The cross-section of an indium tin oxide layer was observed by using a transmission electron microscope (manufactured by Hitachi, Ltd.; product name: H-7650) to measure the thickness of the indium tin oxide layer.

INDUSTRIAL APPLICABILITY

While the uses of the transparent conductive film of the present invention are not limited, the transparent conductive film of the present invention is preferably used for a projection capacitance-type touch panel.

What is claimed is:

1. A transparent conductive film comprising:
   a film substrate having two main surfaces; and
   a transparent conductor layer formed on one main surface of the film substrate,
   wherein the transparent conductor layer is composed of three layers in which a first indium tin oxide layer, a second indium tin oxide layer, and a third indium tin oxide layer are laminated in this order from the film substrate side,
   the first indium tin oxide layer has a smaller tin oxide content than the second indium tin oxide layer, and the third indium tin oxide layer has a smaller tin oxide content than the second indium tin oxide layer, and
   wherein the first indium tin oxide layer has a thickness smaller than the second indium tin oxide layer and the third indium tin oxide layer has a thickness smaller than the second indium tin oxide layer wherein the first indium tin oxide layer has a tin oxide content of 1% by weight to 5% by weight, the second indium tin oxide layer has a tin oxide content of 6% by weight to 15% by weight, and the third indium tin oxide layer has a tin oxide content of 1% by weight to 5% by weight.

2. The transparent conductive film according to claim 1, wherein the difference between the tin oxide content of the second indium tin oxide layer and the tin oxide content of the first indium tin oxide layer is 3% by weight to 10% by weight, and the difference between the tin oxide content of the second indium tin oxide layer and the tin oxide content of the third indium tin oxide layer is 3% by weight to 10% by weight.

3. The transparent conductive film according to claim 1, wherein the first indium tin oxide layer has a thickness of 1 nm to 10 nm, the second indium tin oxide layer has a thickness of over 10 nm to 30 nm, and the third indium tin oxide layer has a thickness of 1 nm to 10 nm.

4. The transparent conductive film according to claim 3, wherein the difference between the thickness of the second indium tin oxide layer and the thickness of the first indium tin oxide layer is 2 nm to 20 nm, and the difference between the thickness of the second indium tin oxide layer and the thickness of the third indium tin oxide layer is 2 nm to 20 nm.

5. The transparent conductive film according to claim 3, wherein the transparent conductor layer has a thickness of 14 nm to 50 nm.

6. The transparent conductive film according to claim 1, wherein the first indium tin oxide layer, the second indium tin oxide layer, and the third indium tin oxide layer in the transparent conductor layer are formed by respectively crystallizing an amorphous layer of indium tin oxide by heat treatment.

7. The transparent conductive film according to claim 6, wherein the crystallization treatment is performed at a temperature of 140° C.

8. The transparent conductive film according to claim 6, wherein the crystallization treatment is performed within 60 minutes.

9. The transparent conductive film according to claim 1, wherein the film substrate is selected from the group consisting of polyethylene terephthalate, polycycloolefin, polycarbonate or a combination thereof.

10. The transparent conductive film according to claim 9, wherein the film substrate has a thickness of 10 μm to 200 μm.

11. The transparent conductive film according to claim 1, wherein the transparent conductive film has a surface resistance of up to 200 ohms per square.

12. The transparent conductive film according to claim 11, wherein the transparent conductive film has a surface resistance of 100 to 200 ohms per square.

13. The transparent conductive film according to claim 1, wherein the transparent conductor layer is patterned.

14. The transparent conductive film according to claim 1, wherein the transparent conductor layer has a thickness of 14 nm to 41 nm.

* * * * *